United States Patent [19]

Yeh

[11] Patent Number: 5,029,130
[45] Date of Patent: Jul. 2, 1991

[54] SINGLE TRANSISTOR NON-VALATILE ELECTRICALLY ALTERABLE SEMICONDUCTOR MEMORY DEVICE

[75] Inventor: Bing Yeh, Los Altos Hills, Calif.

[73] Assignee: Silicon Storage Technology, Inc., Sunnyvale, Calif.

[21] Appl. No.: 467,907

[22] Filed: Jan. 22, 1990

[51] Int. Cl.⁵ .............................................. G11C 11/40
[52] U.S. Cl. ..................................... 365/185; 365/186
[58] Field of Search ........................ 365/174, 185, 186

[56] References Cited

U.S. PATENT DOCUMENTS

| 4,203,158 | 5/1980 | Frohman-Bentcnkowsky . | |
|---|---|---|---|
| 4,274,012 | 6/1981 | Simko . | |
| 4,366,555 | 12/1982 | Hu | 365/185 |
| 4,599,706 | 7/1986 | Guterman . | |
| 4,698,787 | 10/1987 | Mukherjee et al. . | |

OTHER PUBLICATIONS

"Electron Tunneling in Non-Planar Floating Gate Memory Structure", by R. K. Ellis et al., 1982, IEEE.
"A New NMOS Charge Storage Effect", by H. G. Dill et al., Solid State Electronics, 1969, vol. 12, pp. 981–987.

Primary Examiner—Terrell W. Fears
Attorney, Agent, or Firm—Limbach, Limbach & Sutton

[57] ABSTRACT

A single transistor electrically programmable and erasable memory cell is disclosed. The single transistor has a source, a drain with a channel region therebetween, defined on a substrate. A first insulating layer is over the source, channel and drain regions. A floating gate is positioned on top of the first insulating layer over a portion of the channel region and over a portion of the drain region. A second insulating layer has a top wall which is over the floating gate, and a side wall which is adjacent thereto. A control gate has a first portion which is over the first insulating layer and immediately adjacent to the side wall of the second insulating layer. The control gate has a second portion which is over the top wall of the second insulating layer and is over the floating gate. Erasure of the cell is accomplished by the mechanism of Fowler-Nordheim tunneling from the floating gate through the second insulating layer to the control gate. Programming is accomplished by electrons from the source migrating through the channel region underneath the control gate and then by abrupt potential drop injecting through the first insulating layer into the floating gate.

6 Claims, 7 Drawing Sheets

FIG. 4-A-1
FIG. 4-A-2
FIG. 4-A-3
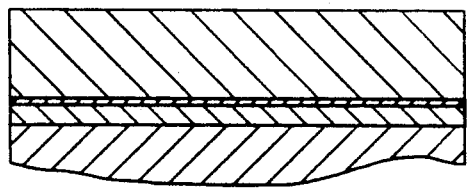
FIG. 4-B-1
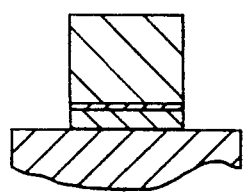
FIG. 4-B-2
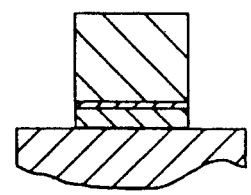
FIG. 4-B-3
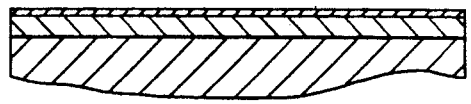
FIG. 4-C-1
FIG. 4-C-2
FIG. 4-C-3
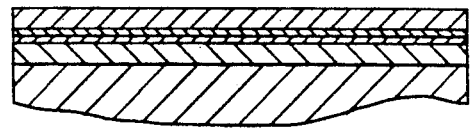
FIG. 4-D-1
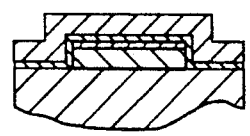
FIG. 4-D-2
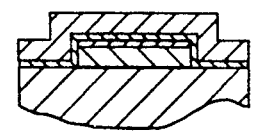
FIG. 4-D-3
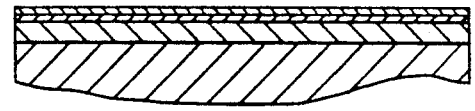
FIG. 4-E-1
FIG. 4-E-2
FIG. 4-E-3

 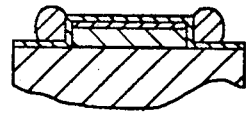 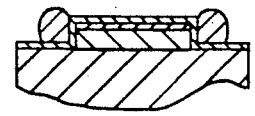
FIG. 4-F-1          FIG. 4-F-2          FIG. 4-F-3
  
FIG. 4-G-1          FIG. 4-G-2          FIG. 4-G-3
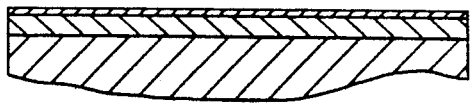 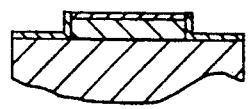 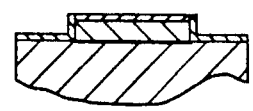
FIG. 4-H-1          FIG. 4-H-2          FIG. 4-H-3
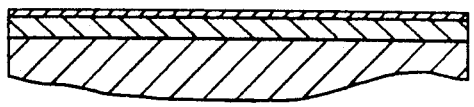 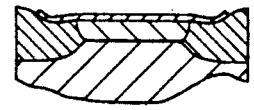 
FIG. 4-I-1          FIG. 4-I-2          FIG. 4-I-3
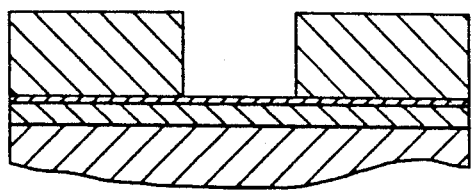 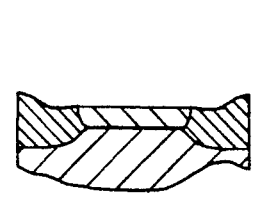 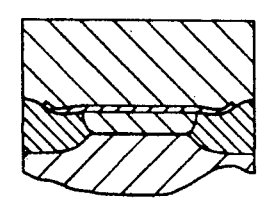
FIG. 4-J-1          FIG. 4-J-2          FIG. 4-J-3

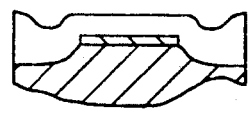
FIG. 4-K-1    FIG. 4-K-2    FIG. 4-K-3
FIG. 4-L-1    FIG. 4-L-2    FIG. 4-L-3
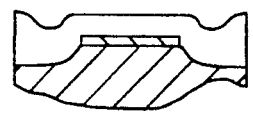
FIG. 4-M-1    FIG. 4-M-2    FIG. 4-M-3
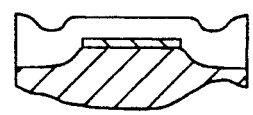
FIG. 4-N-1    FIG. 4-N-2    FIG. 4-N-3
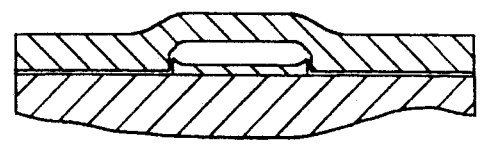
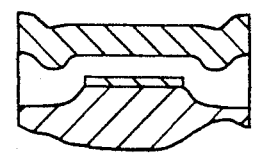
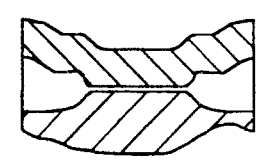
FIG. 4-O-1    FIG. 4-O-2    FIG. 4-O-3

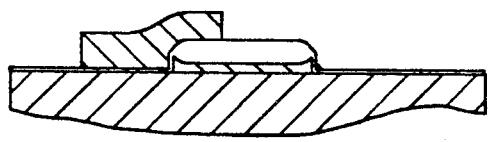 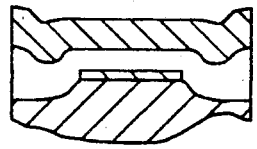 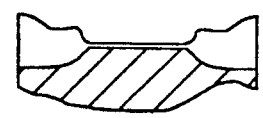
FIG. 4-P-1  FIG. 4-P-2  FIG. 4-P-3
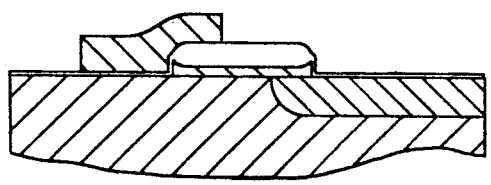 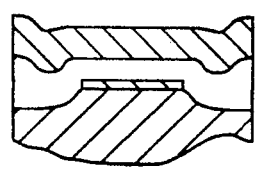 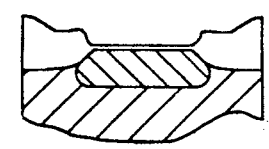
FIG. 4-Q-1  FIG. 4-Q-2  FIG. 4-Q-3
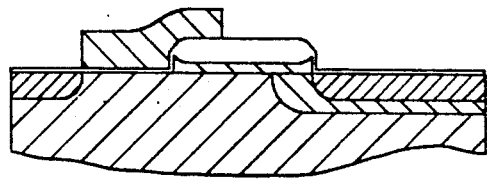 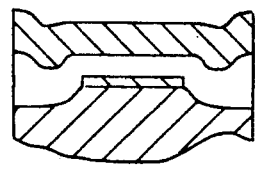 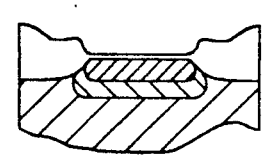
FIG. 4-R-1  FIG. 4-R-2  FIG. 4-R-3
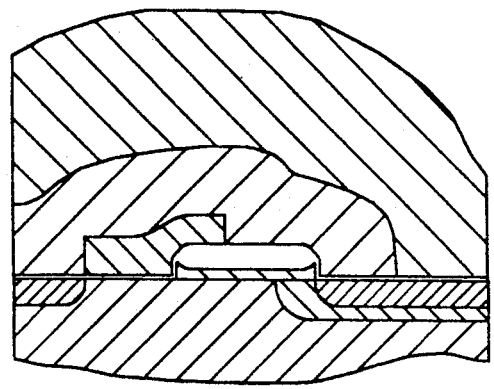 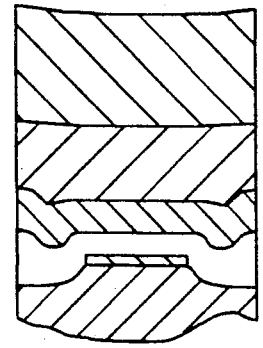 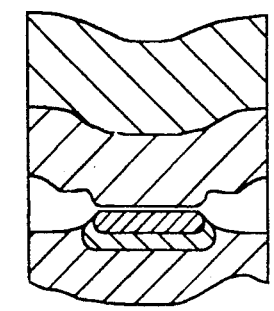
FIG. 4-S-1  FIG. 4-S-2  FIG. 4-S-3

SINGLE TRANSISTOR NON-VALATILE ELECTRICALLY ALTERABLE SEMICONDUCTOR MEMORY DEVICE

TECHNICAL FIELD

The present invention relates to a single transistor electrically programmable and erasable memory device.

BACKGROUND OF THE INVENTION

Non-volatile electrically alterable semiconductor memory devices are well-known in the art. See, for example, U.S. Pat. No. 4,203,158. In such a device, electrical alterability is achieved by Fowler-Nordheim tunneling of charges between a floating gate and the silicon substrate through a very thin dielectric. Typically, the thin dielectric is an oxide layer with a thickness of less than 100 angstroms. However, such a device requires a floating gate transistor and a separate select transistor for each storage site. Thus, necessarily, each storage site or cell is large due to the number of transistors required for each cell. Further, another disadvantage is the reliability and manufacturability problem associated with the thin oxide tunnel element between the substrate and the floating gate.

U.S. Pat. Nos. 4,274,012 and 4,599,706 seek to overcome the program of reliability and manufacturability of the thin oxide tunnel element by storing charges on a floating gate through the mechanism of Fowler-Nordheim tunneling of charges between the floating gate and other polysilicon gates. The tunneling of charges would be through a relatively thick inter-polyoxide. Tunneling through thick oxide (thicker than the oxide layer disclosed in U.S. Pat. No. 4,203,158) is made possible by the locally enhanced field from the asperities on the surface of the polycrystalline silicon floating gate. Since the tunnel oxide is much thicker than that of the tunnel oxide between the floating gate and the substrate, the oxide layer is allegedly more reliable and manufacturable. However, this type of device normally requires three layers of polysilicon gates which makes manufacturing difficult. In addition, voltage during programming is quite high and demands stringent control on the oxide integrity.

Electrically programmable devices which are alterable by application of ultraviolet light treatment, typically known as EPROM devices, are well-known in the art. However, erasure requires erasure of the entire memory device by application of UV light.

Hot electron injection has been proposed by Dill and Toombs in 1969 on an MNOS structure (Vol. 12, Solid State Electronics) to improve switching speed and to reduce the need for a separate select transistor for each cell in a memory array.

Recently, U.S. Pat. No. 4,698,787 discloses a device that is programmable as if it were an EPROM and erasable like an EEPROM. Although such a device requires the use of only a single transistor for each cell, it is believed that it suffers from the requirement of high programming current which makes it difficult to utilize on-chip high voltage generation for programming and erasing. Further, it is believed that such a device requires tight distribution program/erase thresholds during device generation, which results in low manufacturability yield.

SUMMARY OF THE INVENTION

In accordance with the present disclosure, an electrically programmable and erasable memory device is disclosed. The memory device has a plurality of storage sites. A plurality of row address lines, a plurality of column address lines, and a common line is supplied to the plurality of storage sites. Each combination of one of the plurality of row address lines and one of the plurality of column address lines defines a different one of the plurality storage sites. Each of the storage sites comprises a single transistor that has a source coupled to the common line, a drain coupled to an associated one of the plurality of column address lines and a control gate coupled to an associated one of the plurality of row address lines. A floating gate is positioned between the control gate, the source and the drain and is capacitively coupled to the drain. Means for injecting hot electrons generated by abrupt potential drop onto the floating gate when the associated ones of the column address and row address lines are raised to a first pre-determined potential above that of the common line is provided. The potential applied to the associated one of the column address lines is above the potential applied to the associated one of the row address lines. Finally, means for inducing Fowler-Nordheim tunneling charges from the floating gate to the control gate is provided. Tunneling occurs when the associates row address line is raised to a second pre-determined potential above the associated column address line.

BRIEF DESCRIPTION OF THE DRAWINGS

FIG. 4(a-1 ... s-1), 4(a-2 ... s-2), and 4(a-3 ... s-3) are cross sectional side views in the cell height direction, through the stack-gate region, and through the drain region, respectively, of the memory cell of FIG. 1, showing the steps in a method of making the memory cell.

DETAILED DESCRIPTION OF THE DRAWINGS

Figure 1:
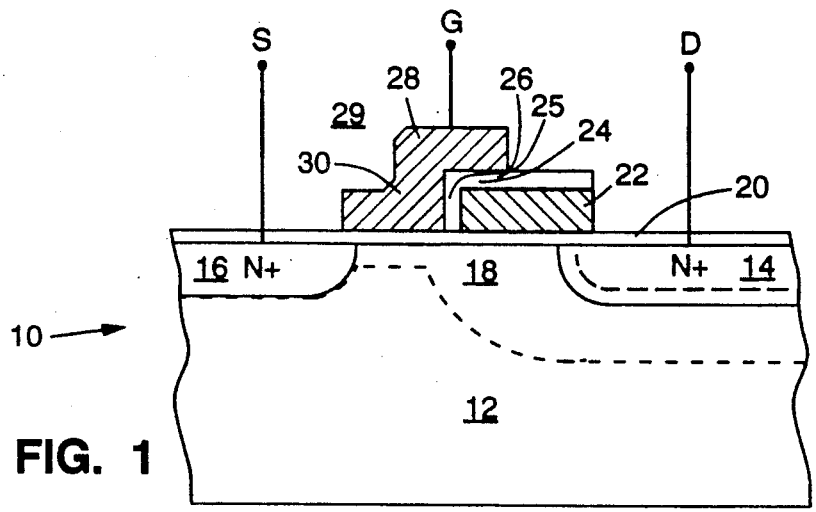
FIG. 1 is a cross-sectional side view of a single transistor non-volatile electrically alterable memory cell.

Referring to FIG. 1, there is shown a single transistor non-volatile electrically alterable semiconductor memory cell 10. The cell 10 comprises semiconductor substrate 12, such as silicon. The substrate 12, in one embodiment, can be a P-type silicon substrate with a typical doping level range from 5 to 50 ohm-cm, depending on the level of scaling. (A more detailed description of the method of manufacturing the cell 10 will be discussed hereinafter.)

Within the substrate 12 are defined source region 16 and drain region 14 with a channel region 18 therebetween. Disposed over the source region 16, channel region 18, and drain region 14 is a first layer 20 of insulating material, on the order of 70-200 angstrom of thickness. The first layer 20 can be an insulating material made from silicon dioxide, silicon nitride or silicon oxynitride. Disposed over the first layer 20 is a floating gate 22. The floating gate 22 is positioned over a portion of the channel region 18 and over a portion of the drain region 14. The floating gate 22 can be a polysilicon gate and in one embodiment is a re-crystallized polysilicon gate. A second insulating layer 25 has a first portion 24 disposed over the floating gate 22 and a second portion 26 disposed adjacent to the floating gate 22. The first portion 24 (top wall 24) of the second layer 25 is an insulating material and can be silicon dioxide, silicon nitride or silicon oxynitride and is on the order of 1000-3000 angstrom in thickness. The second portion 26 (side wall 26) of the second layer 25 is also of an insulating material and can be silicon dioxide, silicon nitride or silicon oxynitride and is on the order of 150-1200 angstrom in thickness. A control gate 29 has two portions: A first portion 28 is disposed over the top wall 24 of the second layer 25; a second portion 30 is disposed over the first layer 20 and is immediately adjacent to the side wall 26 of the second layer 25. The second portion 30 of the control gate 29 extends over a portion of the source region 16 and over a portion of the channel region 18.

The dimensions of the cell 10 depend upon the process used. Thus, the foregoing dimensions for the first layer 20, side wall 26, and top wall 24 are only illustrative examples. Further, the material for the first layer 20 and the second layer 25 are also illustrative examples only. In general, that electrons emanating from the source region 16 are injected onto the floating gate 22 by sensing an abrupt potential drop. (The specific mechanism of the theory of operation of the cell 10 will be explained in greater detail hereinafter.) Further, the dimensions of cell 10 must be such that charges from the floating gate 22 are removed by tunneling through the Fowler-Nordheim mechanism through the second layer 25 onto the control gate 29. The particular manner of operating the cell 10 is as follows:

Initially, when it is desired to erase cell 10, a ground potential is applied to the drain 14 and to the source 16. A high-positive voltage, on the order of +15 volts, is applied to the control gate 29. Charges on the floating gate 22 are induced through the Fowler-Nordheim tunneling mechanism to tunnel through the second layer 25 to the control gate 29, leaving the floating gate 22 positively charged.

When selective cells 10 are desired to be programmed, a ground potential is applied to the source region 16. A positive voltage level in the vicinity of the threshold voltage of the MOS structure defined by the control gate 29, (on the order of approximately of +1 volt), is applied to the control gate 29. A positive high voltage, on the order of +12 volts, is applied to the drain region 14. Electrons generated by the source region 16 will flow from the source region 16 towards the drain region 14 through a weakly-inverted channel region 18. When the electrons reach the region where the control gate 29 meets the side wall 26, the electrons see a steep potential drop approximately equal to the drain voltage, across the surface region defined by the gap of the side wall 26. The electrons will accelerate and become heated and some of them will be injected into and through the first insulating layer 20 onto the floating gate 22.

The injection of electrons onto the floating gate 22 will continue until the charged floating gate 22 can no longer sustain a high surface potential beneath, to generate hot electrons. At that point, the electrons or the negative charges in the floating gate 22 will "turn off" the electrons from flowing from the source region 16 onto the floating gate 22.

Finally, in a read cycle, ground potential is applied to the source region 16. Conventional transistor read voltage, such as +2 volts and +5 volts, are applied to the drain region 14 and to the control gate 29, respectively. If the floating gate 22 is positively charged (i.e., the floating gate is discharged), then the channel region 18 directly beneath the floating gate 22 is turned on. When the control gate 29 is raised to the read potential, the region of the channel region 18 directly beneath the second portion 30 is also turned on. Thus, the entire channel region 18 will be turned on, causing electrical current to flow from the drain region 14 to the source region 16. This would be the "1" state.

On the other hand, if the floating gate 22 is negatively charged, the channel region 18 directly beneath the floating gate 22 is either weakly turned on or is entirely shut off. Even when the control gate 29 and the drain region 14 are raised t o the read potential, little or no current will flow through the portion of the channel region 18 directly beneath the floating gate 22. In this case, either the current is very small compared to that of the "1" state or there is no current at all. In this manner, the cell 10 is sensed to be programmed at the "0" state.

Figure 2:
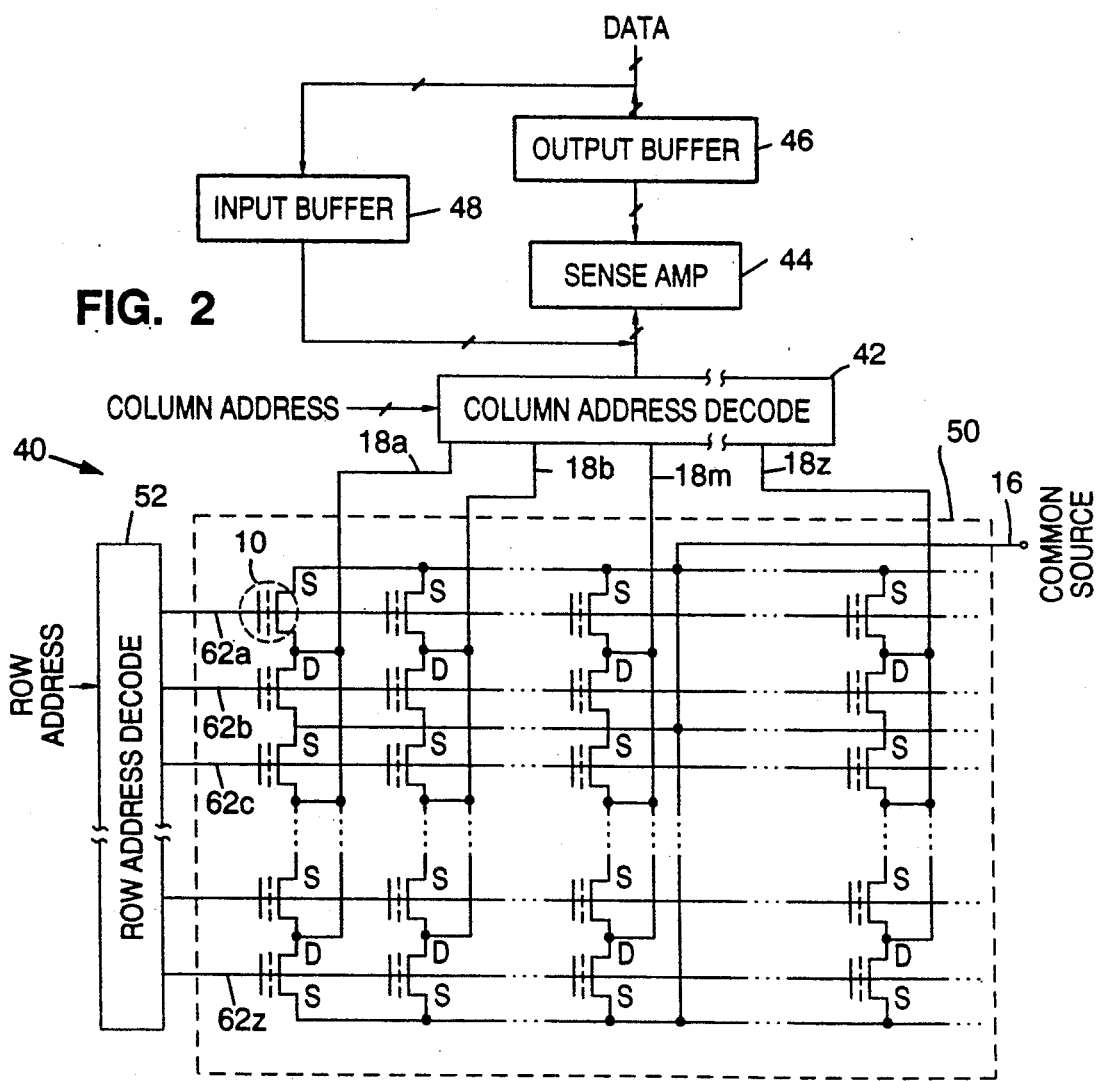
FIG. 2 is a schematic diagram of a memory device using an array of the memory cells shown in FIG. 1.

Referring to FIG. 2, there is shown a memory device 40. The memory device 40 has an array 50 of memory cells. The peripheral circuitry on the device 40 includes conventional row address decoding circuitry 52, column address decoding circuitry 42, sense amplifier circuitry 44, output buffer circuitry 46 and input buffer circuitry 48. These conventional circuits correspond to the peripheral devices of the prior art.

The interconnection of the source, drain and gate of each of the cell 10 to the memory array 50 is as follows: All of the source 16 of each of the memory cell 10 are connected to the other through a common source line. The drain 14 of each of the cell 10 in the same column are connected together. Thus, column 18a has connected thereto the drain from each of the cell 10 in the leftmost column. The plurality of columns 18(a . . . z) are connected to the column address decode 42. The gate 28 of each of the memory cells 10 in the same row are connected together. Thus, the row signal line 62a connects to the gate 28 of each of the memory cells 10 in the uppermost row. The plurality of rows 62(a . . . z) are supplied to the row address decode 52.

In the operation of the memory array 50, in the event an erased mode is desired, the plurality of column address lines 18(a . . . z) are all brought to a ground potential. The common source line 16 is also brought to a ground potential. The plurality of row address lines 62(a . . . z) are all brought to a high positive potential, such as +15 volts. In this manner, all of the memory cells 10 in the memory array 50 are erased. When only a selected row of the memory array 50 is to be erased, the particular row address line, e.g., 62m, is raised to a high positive potential, such as +15 volts with the rest of the row addresses at ground potential. In this manner only the memory cells in row 62m are erased.

Thereafter, for selective programming of selected memory cells 10, programming is accomplished as follows: The common source line 16 is again brought to ground potential. The particular row address line 62m, which is connected to the gate 28 of the particular memory cell 10 to be programmed is brought to a +1 volt. The unselected row address lines 62(a . . . l,n . . . z) are brought to a ground potential. The column address line 18m of the particular memory cell 10 selected is brought to a high positive potential, such as +12 volts.

The unselected column lines 18(a ... 1, n ... z) are brought to a ground potential.

The voltage supplied to the various contacts of the selected memory cell 10 are as follows: Drain 14 is brought to a +12 volts, source 16 is brought to a ground potential, and gate 28 is brought to +1 volt. This causes programming of the selected memory cell 10, as previously discussed.

The voltage supplied to the unselected memory cell 10 can have the following possible voltage potentials supplied thereto: For all of the memory cells 10 in the selected row 62m, the source 16 is at ground potential, the drain 14 is at ground potential, and the gate is at +1 volt. In this condition, since the drain 14 is at the same potential as the potential of the source 16, electrons will not migrate from the source 16 through the channel region 18, beneath the control gate 29, onto the floating gate 22.

For all of the memory cells 10 in the same column 18m as the selected memory cell 10, the voltage potential applied to the various regions are as follows: Source 16 is at ground potential, drain 14 is at +12 volts, the control gate 28 is at ground potential. In this configuration, although the drain 14 is at a higher positive potential than the source 16, there is no induced channel beneath the control gate 28. Thus, there is no flow of electrons from the source 16 to the control gate 28 and through the first insulating layer 20 to the floating gate 22.

Finally, with respect to the memory cells that are not in the same row 62m or in the same column 18m as the selected memory cell 10, the voltage potential applied to the various regions of the memory cell 10 are as follows: Ground potential to the source 16, ground potential to the gate 28 and ground potential to the drain 14. In this configuration, of course, no electron flow occurs at all.

Finally, when a read operation is desired, the common source line 16 is brought to a ground potential. The selected column address line 18m, supplied to the selected memory cell 10, is brought to a +2 volts. The selected row address line 62m, connected to the selected memory cell 10, is brought to a +5 volts. The selected memory cell 10 can thus be read out.

Theory Of Operation

If we assume the substrate 12 is to be of P-type conductivity and the source region 16 and the drain region 14 to be N-type conductivity, then the following occurs.

Erase

The source region 16 and the drain region 14 are supplied with equal potential and at a reference potential, for example, ground potential. The control gate 28 is raised to a predetermined potential $V_e$ above the reference potential supplied to the source 16 and the drain 14. The strong coupling from the floating gate 22 to the body 12 and drain 14 will cause a high voltage drop between the floating gate 22 and the control gate 28. This voltage drop will, in turn, cause electrons to tunnel from the floating gate 22 to the control gate 28 by the mechanism of Fowler-Nordheim tunneling. This tunneling occurs due to the locally-enhanced field on the surface of the floating gate 22. The local enhancement of the electric field can be due to the unsmoothed grain size of the floating gate 22, or asperity on the floating gate 22, which is typically made of polysilicon. It can also be due to a purposely created sharp edge on the floating gate 22 through properly designed process. Once the positive charges are gradually built up on the floating gate 22; i.e., electrons are tunneled away from the floating gate 22 onto the control gate 28, the voltage potential drop between the floating gate 22 and the control gate 28 will continue to decrease until the potential drop can no longer sustain a significant amount of Fowler-Nordheim tunneling. At this final voltage drop between the control gate 28 and the floating gate 22, which is labelled $V_x$, the total positive charge $+Q_{fg}$ on the floating gate 22 can be estimated to a first order by the following equation:

$$+Q_{fg} = (V_e - V_x - V_{ie})*(C_{fc} + C_{fb} + C_{fd})$$

where $C_{fc}$ is the capacitance between the floating gate 22 and the control gate 28;

$C_{fb}$ is the capacitance between the floating gate 22 and the body 12;

$C_{fd}$ is the capacitance between the floating gate 22 and the drain 14; and $$V_{ie} V_e * C_{fc}/(C_{fc} + C_{fb} + C_{fd})$$

is the initial floating gate potential when it is free from charge.

$V_e$ is the erase voltage.

If $C_{fc}$ is much smaller than the total floating gate capacitance $(C_{fc} + C_{fb} + C_{fd})$, then $V_{ie}$ is quite small compared to $V_e$ and $V_x$. Thus, the positive floating charge can be approximated by $$+Q_{fg} = (V_e - V_x)*(C_{fc} + C_{fb} + C_{fd})$$

In fact, in a preferred embodiment, it is desired to minimize $C_{fc}$ and maximize $C_{fd}$. Thus, the amount of the second portion 28 of the control gate 29 over the second insulating layer 25 should be minimized. Similarly, the amount of the floating gate 22 directly over the drain 14 is maximized.

Program

After the cell 10 is erased and the floating gate 22 is positively charged, the source region 16 and the control gate 28 are maintained at the ground potential. The voltage potential supplied to the drain 14 of the selected memory cell 10 is raised to a predetermined potential $V_p$ above ground potential. The induced surface charge underneath the floating gate 22 will propagate the drain potential along the induced channel under the floating gate 22 to the region where the floating gate 22 meets the side wall 26. The floating gate 28 is nearly at a potential given by the following equation:

$$V_{fg} = (Q_{fg} + C_{fd}*V_p + C_{fb}*V_p)/(C_{fc} + C_{fb} + C_{fd})$$

where $V_p$ is the programming voltage.

If the control gate 28 is raised to a potential $V_t$, slightly above the ground potential and is near the threshold voltage, such that the channel region 18 directly beneath the control gate 28 is slightly on, the sub-threshold electron current will begin to flow from source 16 towards drain 14. The current will flow through the weakly-inverted channel. When the electron reaches the region where the first portion 30 of the control gate 28 meets the side wall 26 of the second insulating layer 25, the electrons see a steep potential drop, approximately equal to the drain voltage, across the surface region defined by the gap between the control gate 28 and the floating gate 22. The electrons will be accelerated and become heated. Some of them will be injected through the first insulating layer 20 and into the floating gate 22, because of the attractive electrostatic force from the floating gate 22. This process continues until the positive charges on the floating gate 22 are neutralized by the injected electrons and the voltage potential on the floating gate 22 will continue to drop until it can no longer sustain an induced surface channel immediately beneath the floating gate 22.

The charge carriers under the floating gate 22 are now depleted by the drain voltage and a deep depletion region is formed under the floating gate 22 (shown by the dotted lines in FIG. 1). This charge depletion region will make the capacitance $C_{fb}$ become negligible compared to $C_{fd}$ and $C_{fc}$. Thus, the floating gate potential can be approximated by $$V_{fg} = (Q_{fg} + C_{fd}*V_p)/C_{fc} + C_{fd})$$

As long as the surface potential under the floating gate 22 can sustain a high enough voltage drop across the surface region defined by the gap between the floating gate 22 and the control gate 28 to induce hot electrons, the electron injection will continue and negative charges will gradually build up on the floating gate 22. The potential on the floating gate 22 will decrease until it reaches a lower value $V_y$, such that the electron injection current becomes negligible. This then completes a programming cycle.

The total negative charges on the floating gate after programming can be approximated, to the first order, by the following equation:

$$-Q_{fg} = (V_y - V_{ip})*(C_{fc} + C_{fd})$$

where $$V_{ip} = (C_{fc}*V_t + C_{fd}*V_p)/(C_{fc} + C_{fd})$$

is the floating gate potential when it is free from any charge.

Because of the high electric field induced across the surface region defined by the gap between the floating gate 22 and the control gate 28, the efficiency of hot electron generation is very high. Furthermore, because there is attractive vertical field from the floating gate, the injection efficiency of hot electron onto the floating gate is also very high. As a consequence, the programming current can be maintained at a very low level. This is much smaller than the drain current used in the programming of a conventional EPROM cell, which requires both the drain and the control gate at high voltage and operates the MOS transistor in the current saturation mode. Thus, it is possible to supply the high voltage for a memory array 50 with an on-chip charge pump.

Read

The sensing of the state of the memory cell 10 or the memory array 50 can be accomplished by conventional scheme. The source 16 is maintained at a ground potential. The drain 14 is maintained at a read voltage, which is typically +2 volts and is much smaller than the programming potential.

In one case, if the floating gate 22 is positively charged, then the channel region 18 directly beneath the floating gate 22 is normally turned on. When the control gate 28 is raised to a read potential, e.g., +5 volts, which is smaller than the potential during erase, to turn on the channel region 18 under the first portion 30 of the control gate 28, electrical current will flow from the drain 14 to the source 16. In this manner, the memory cell 10 can be sensed at a erased state or "1" state.

On the other hand, if the floating gate 22 is negatively charged, the region of the channel 18 directly beneath the floating gate 22 is either weakly turned on or is entirely shut off. Thus, even when the control gate 28 and the drain region 14 are raised to a read potential, turning on the region of the channel 18 directly underneath the first portion 30 of the control gate 28, the region of the channel 18 underneath the floating gate 22 is not on and thus, the current through the channel 18 is either very small compared to the erased "1" state or is no current at all. In this condition, the cell 10 is sensed to be a programmed state of "0".

Disturb Analysis

In a memory array 50 composed of EEPROM memory cells 10, there are undesirable high voltage stress conditions, either during read or write, that causes the charges on the floating gate 22 to leak. This read disturb and write disturb phenomena can be minimized with the present memory cell 10.

Since the memory cell 10 is operated under the condition that the capacitive coupling between the floating gate 22 and the drain region 14 is very strong, the floating gate potential is always very close to the potential of the drain region 14. In both positively- or negatively-charged conditions, the voltage drop between the floating gate 22 and the drain region 14 is small enough that the leakage current is negligible. Thus, for the following analysis, the leakage path from the floating gate 22 to the drain node 14 can be effectively ignored.

During the read disturb condition, if the floating gate 22 is in an erased state, i.e., the floating gate is positively charged, the potential drop between the floating gate 22 and the control gate 28 is small. This results in a negligible leakage current. On the other hand, if the floating gate 22 is in the programmed state, i.e., negatively-charged, the voltage drop between the floating gate 22 and the control gate 28 can be as high as four to five volts. Further, the voltage drop would have the same voltage bias direction as that of the erase condition. However, the nature of Fowler-Nordheim tunneling is that, at lower voltage, the I-V relation is characterized by a very steep curve. This is especially true for Fowler-Nordheim tunneling current injected from a textured polysilicon surface. The cell operation condition can be designed such that the total charge leaked during the useful lifetime of the memory device is not high enough to flip the memory state from programmed "0" state to erased "1" state.

In write disturb condition, during erase, the unselected cell is always in the condition that all three nodes, i.e., source 16, control gate 28 and drain 14, are at ground potential. Therefore, there is no disturbance in this condition.

During programming, however, the worst case disturb condition on an unselected cell is developed when the floating gate 22 is positively-charged, and the drain node 14 is raised to the programming potential. In such a condition, the floating gate potential is defined by the following equation:

$$V_{fg}=(Q_{fd}+C_{fd}\cdot V_p+C_{fb}\cdot V_p)/(C_{fc}+C_{fb}+C_{fd})$$

Thus, the voltage dropped across the floating gate 22 and the control gate 28 which is at a ground potential for an unselected cell 10 can be several volts higher than the programming voltage $V_p$. However, the polarity of the voltage bias is opposite to that during erase operation. The asperities on the polysilicon surface exhibits a reversed-biased Fowler-Nordheim tunneling current which is many orders of magnitude weaker than that of a forward bias condition. Because of this asymmetrical nature of Fowler-Nordheim I–V characteristics for the electron current emitted from the polysilicon asperity, the operation condition of the cell 10 can be designed in such way that the total charge loss in the useful life of the memory cell 10 due to this disturbed current can be minimized and ignored.

Method Of Manufacturing

Figure 3A:
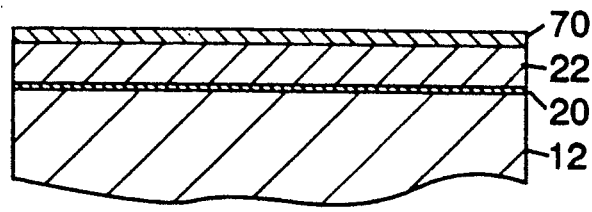
FIG. 3(a-i) are cross-sectional side views of the memory cell of FIG. 1, showing the steps in a method of making a recrystallized floating gate of the memory cell.

As previously discussed, in a preferred embodiment, the floating gate 22 is a recrystallized silicon gate. The recrystallized silicon gate 22 can be formed as follows:

Referring to FIG. 3a, there is shown a cross-sectional view of a first step in a method of making a memory cell 10 having a recrystallized floating gate 22. A first insulating layer 20 or the gate oxide layer 20 is grown on a silicon substrate 12. Thereafter, polysilicon 22 or amorphous silicon 22 is deposited on the first insulating layer 20. The polysilicon 22 or amorphous silicon 22 is then capped with a silicon nitride layer 70. The silicon nitride layer 70 can be deposited by conventional CVD (Chemical Vapor Deposition) process. The structure of FIG. 3a is then subject to long-term thermal cycle, e.g., 1100° to 1200° C. The thermal cycle causes annealing of the polysilicon or amorphous silicon 22 forming recrystallized silicon or nearly single crystalline silicon 22. The annealing process need not proceed until a single crystal silicon is produced. So long as the grain dimensions of the silicon 22 that results from the recrystallization process is relatively much larger than the size of the charge injection element, the charge injection element itself becomes, in essence, a single crystalline silicon. In other words, if the recrystallization process results in layer 22 being composed of many connected single crystalline silicon, the recrystallization is acceptable so long as each of the single crystal silicon is large compared to the dimensions of the charge injection element. Since this annealing process is done at the beginning of the manufacturing of the memory cell 10, it can be treated at a relatively high temperature for relatively long period of time. Of course, if the annealing process is long enough, then a single crystalline silicon floating gate 22 is produced.

To define the charge injection region along the edge of the recrystallized silicon layer 22, one of the two following methods may be employed.

Figure 3B:
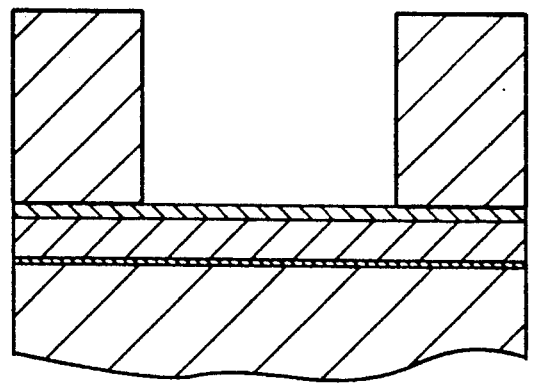

The first method is to selectively open up the silicon nitride layer 70 in places where the final floating gate 22 will be defined (see FIG. 3b).

Figure 3C:
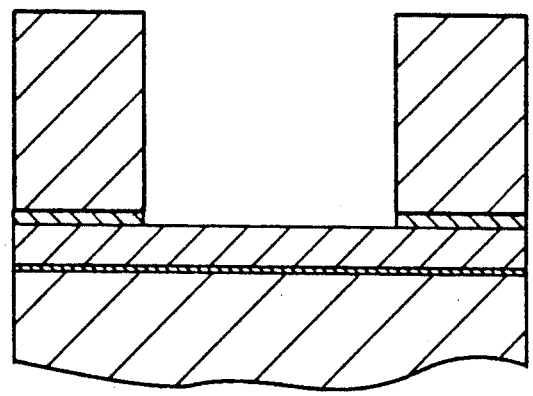

The exposed silicon nitride region 70 is then removed (see FIG. 3c).

Figure 3D:
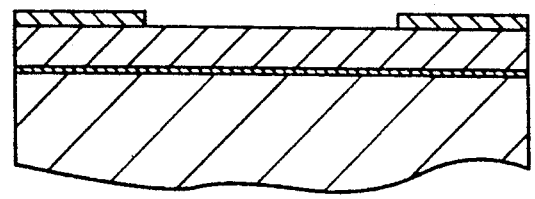

The resist mask is then removed (see FIG. 3d).

Figure 3E:
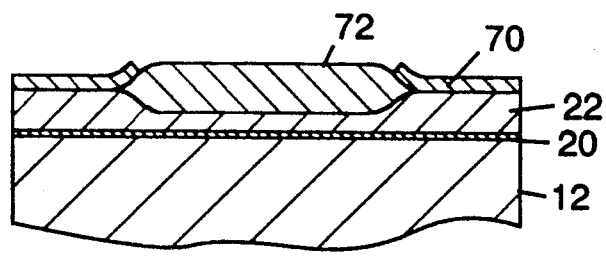

This leaves the recrystallized silicon 22 exposed. The exposed recrystallized silicon 22 is then oxidized to a certain thickness; e.g., 2000 angstroms (see FIG. 3e). This causes the formation of an oxide layer 72 resembling a bird's beak at the border of the silicon nitride layer 70. The formation of the "bird's beak" is causes by the same reason as that for the formation of the "bird's beak" after a LOCOS Field Oxidation Process (a well-known conventional process). The unoxidized, recrystallized silicon layer 22 beneath the oxide layer 72 exhibits a "curved-up shape". At a point where the unoxidized, recrystallized silicon 22 reaches a peak, the charge injection area will be defined.

Figure 3F:
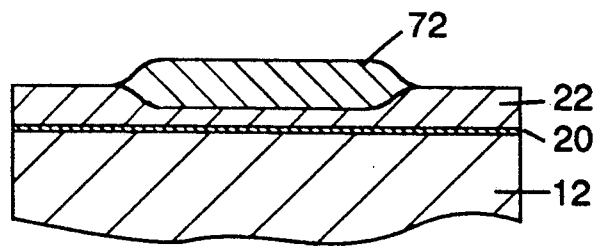

The silicon nitride layer 70 is then etched away, leaving the oxide portion of the recrystallized silicon layer 22 unchanged (see FIG. 3f).

Figure 3G:
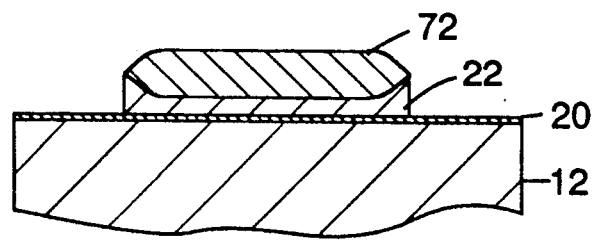

Anisotropic silicon etch process; e.g., reactive ion etch, is then applied to selectively etch the exposed, recrystallized silicon layer 22 which is not directly beneath the oxide layer 72 (see FIG. 3g). This leaves the final recrystallized silicon floating gate 22 defined under the oxide layer 72.

The sharp curved-up portion at the recrystallized silicon edge of the recrystallized silicon layer 22 forms the charge injection region. In FIG. 3g, this is an edge which is aligned along the recrystallized silicon edge. With a sharply defined charge injection edge, the tunneling probability of electrons is at the highest. This results in a floating gate 22 having a well-defined charge injection edge to cause tunneling of charges from the floating gate 22 to control gate 29.

A second method to define the charge injection region along an edge of the recrystallized silicon layer 22 can be done as follows:

The recrystallized silicon layer 22 is selectively etched to define the floating gate 22 with straight sidewalls.

The recrystallized floating gate 22 is then oxidized to a certain thickness and then the oxide layer is isotropically etched away.

The recrystallized floating gate 22 is once again re-oxidized to a desired oxide thickness. The steps of oxidizing the recrystallized silicon to a certain thickness and then isotropically etching away the oxide layer is repeated until a desired shape is formed at the corner for use as an efficient electron injector. The formation of a sharp corner which is defined by the crystalline edge (100) and (110) surface through prolonged single oxidation step on a single crystalline silicon has been previously reported in the *Journal of the Electrochemical Society*, page 1278, June 19, 1982.

Figure 3H:
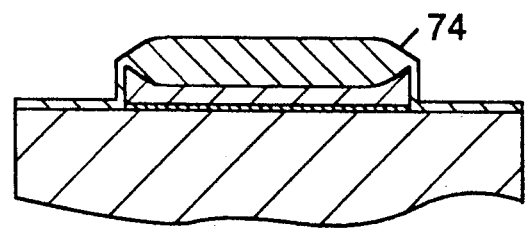
Figure 3I:
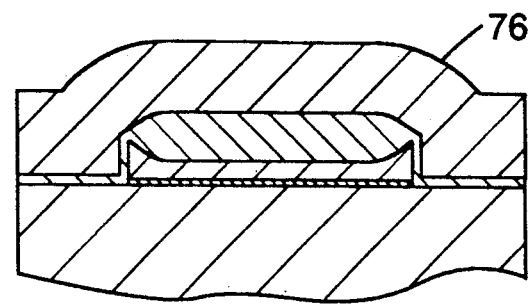

To grow high endurance tunneling dielectric on the recrystallized floating gate 22 and to reduce the charge trapping and dielectric defects, the method continues as follows:

A thermal oxide layer 74 is grown to a certain thickness over the floating gate 22 (see FIG. 3h).

Nitridization of the oxide layer 74 is performed by thermally annealing the oxide layer 74 with dilute NH$_3$ using N$_2$ or Ar as a carrier gas at an elevated temperature; e.g., greater than 800° C. This will result in the formation of an oxynitride film. The oxynitride film has less trapping than thermal oxide in a crystalline substrate.

Finally, as an optional step, an additional oxidation step may be applied to the oxynitride film. This would help to reduce the defect density by sealing off pin holes, with the rest of the surface oxynitride layer serving as an oxidation-retarding layer. By properly adjusting the nitridation and the final oxidation conditions, the film can be made very trap-free, exhibiting extremely good dielectric integrity; i.e., low-charge trapping, low defect density, high breakdown field, tight distribution in tunneling voltage and breakdown voltage.

Finally, a second polysilicon layer 76 is deposited over the oxynitride layer 74 which is the second insulating layer 25. The second polysilicon layer 76 is defined to form the control gate 29.

A complete, more detailed method of manufacturing the memory cell 10 will now be described.

The starting material is assuming to be P-type silicon substrate with a typical doping level ranging from 5 to 50 Ohm-cm, depending on the level of scaling.

First, a first layer of dielectric material is thermally grown on the substrate. This layer is eventually going to be the insulating dielectric underneath the floating gate. The material can be silicon oxide, silicon nitride, or silicon oxynitride. The thickness of this layer ranges from 50 to 200 angstroms, depending upon the level of scaling.

Thereafter, a layer of amorphous silicon material is deposited by LPCVD (Low-Pressure Chemical Vapor Deposition) Process. The thickness ranges from 1000 to 2500 angstroms, depending on the level of scaling.

Further, a layer of silicon nitride material is deposited by LPCVD Process. The thickness of the silicon nitride layer is such that it can act as an oxygen diffusion barrier at high temperature and yet to be thin enough, such that the stress induced is negligible. A typical thickness range is from 200 to 600 angstroms. The combined structure is then annealed in a diffusion furnace with temperature ranging from 1150° C. to 1350° C. The annealing time is such that the amorphous silicon is converted nearly into single crystalline silicon having a grain size of a few microns at least. The typical annealing time is a couple of hours to ten hours, depending on the annealing temperature. The result of this can be seen in FIG. 4a.

Photoresist is spun on the structure and slots are opened to expose the top of the silicon nitride material by conventional, photolithographic technique to define the isolation region between cells (see FIG. 4b).

Using the photoresist as a mask, the silicon nitride and the recrystallized silicon layer is removed by dry etch technique, such as RIE (Reactive Ion Etch) Process. The photoresist mask is stripped by conventional means (see FIG. 4c).

The following steps are optional steps to reduce the bird's beak in the field oxide and the encroachment of boron-doping during field oxidation and subsequent thermal steps:

A layer of 200 to 400 silicon nitride is deposited by LPCVD Process. A layer of approximately 1500 to 2500 angstroms of polysilicon is deposited also by LPCVD Process on the silicon nitride (see FIG. 4c).

The polysilicon sidewall spacers are formed by anisotropically removing the polysilicon on the horizontal portion of the structure using RIE Process (see FIG. 4e).

The polysilicon spacer is converted into oxide by thermal oxidation process (see FIG. 4f).

The method continues by channel-stop implant of BF$_2$. The implantation energy is chosen, such that the implanted ions will not penetrate through the silicon nitride/silicon/silicon oxide layers and will only implant into the silicon substrate in the regions opened by the first mask and not protected by the oxide spacer (see FIG. 4g). These following two steps are, again, optional:

The last-deposited nitride layer is removed from areas where they are not protected by the oxide spacer.

The oxide spacer is removed with dilute HF dip (see FIG. 4h).

Field oxide is then grown to a thickness ranging from 3000 to 7000 angstroms, depending on the level of scaling (see FIG. 4i).

Photoresist is then spun on and stripes of openings perpendicular to the isolation slots are made by conventional photolithographic technique to define the floating gate area. Phosphorous implantation is then performed to dope the floating gate. The implantation energy is such that the implanting ions will mostly reside within the recrystallized silicon layer and will not penetrate into the silicon substrate. The typical dose ranges from $1 \times 10^{-14}$ to $1 \times 10^{15}$ ions per cm$^2$. With the photoresist as a mask, the silicon nitride layer is selectively removed on the silicon nitride/silicon/silicon oxide stack using RIE process (see FIG. 4j).

The photoresist mask is then removed using conventional means. Using the remaining nitride as an oxidation resistant mask, thermal oxide is grown and part of the recrystallized silicon layer is converted into oxide. The oxide thickness ranges typically from 1000 to 2500 angstroms, depending on the thickness of the original amorphous silicon layer and the level of scaling. In so doing, a mini-bird's beak is formed on the silicon along the nitride boundaries defined by the second mask (see FIG. 4k).

The remaining silicon nitride layer is removed by wet chemical etch in a hot phosphoric acid bath (see FIG. 4l).

Using the oxide as a mask, the exposed recrystallized silicon region is selectively etched by RIE Process. The etching selectivity between silicon and oxide should be large enough; e.g., greater than 20, to ensure a sharp-edge profile. A silicon etch process with selectivity greater than 25 is readily available using conventional RIE silicon etch process with chlorine-based chemistry (see FIG. 4m).

A sacrificial oxide layer is thermally grown on the exposed sidewall of the recrystallized silicon layer. At the same time, the oxide thickness on the substrate that was originally covered by the silicon nitride/silicon stack is increased to a desired thickness. The typical thickness ranges from 400 to 500 angstroms (see FIG. 4n).

With the floating gate as a mask, a self-aligned boron implant is performed to adjust the threshold in the region where select transistor is going to be formed. The oxide layer is partially removed by dipping in a dilute HF solution. The oxide is then grown again to reach a final desired thickness on the silicon substrate and on the recrystallized silicon sidewall. These two thicknesses may be different as a result of doping level and crystal orientation. The typical thickness ranges from 300 to 500 angstroms on the silicon substrate and 400 to 600 angstroms on the recrystallized silicon sidewall.

Nitridation of the oxide by thermally annealing the oxide in dilute NH$_3$, using N$_2$ or Ar as the carrier gas and an elevated temperature is performed. The temperature range is typically from 800° C. to 1000° C. An optional, short oxidation and temperature range from 850° C. to 950° C. is performed. The time is made short enough such that it does not increase the oxide thickness significantly and is yet long enough to grow oxide to seal off any pin hole defects. A layer of polysilicon is then deposited and is doped by conventional means (see FIG. 4o).

The polysilicon is patterned to form the control gate using conventional photolithographic and dry-etching techniques (see FIG. 4p).

Photoresist is spun and strips of openings perpendicular to the isolation stripes is performed by conventional photolithographic techniques to expose parts of the floating gate and the drain area. Using photoresist and the exposed portion of the floating gate as a mask, phosphorus implantation is performed. The dosage is adjusted such that in subsequent thermal steps, the phosphorus N+ junction will diffuse and overlap underneath the floating gate. The amount of overlap is determined by the desired degree of drain coupling and can range from 0.2 to 0.6 micron, depending on the level of scaling (see FIG. 4q).

The photoresist mask is stripped using conventional means. The source and drain regions are formed (see FIG. 4r).

A first passivation glass layer, contact holes, metallization, top passivation and bonding pad layers are performed by conventional means to complete the process (see FIG. 4s).

What is claimed is:

1. An electrically programmable and erasable memory device having a plurality of storage sites, a plurality of row address lines, a plurality of column address lines, and a common line, wherein each combination of one of the plurality of row address lines and one of the plurality of column address lines define a different one of the plurality of storage sites, and further wherein each of the plurality of storage sites comprises a single transistor, said single transistor comprising:
    a source coupled to said common line;
    a drain coupled to an associated one of the plurality of column address lines;
    a control gate coupled to an associated one of the plurality of row address lines;
    a floating gate positioned between the control gate and the source and the drain and being capacitively coupled to the drain;
    means for injecting hot electrons generated by abrupt potential drop onto the floating gate when the associated ones of the column address and row address lines are raised to a first predetermined potential above that of the common line, with the potential applied to said associated one of the column address lines being above the potential applied to said associated one of the row address lines; and
    means for inducing Fowler-Nordheim tunneling of charges from the floating gate to the control gate when the associate row address line is raised to a second predetermined potential above the associated column address line.

2. The device of claim 1, wherein the injecting and inducing means comprises:
    a first layer of insulating material, having a dielectric constant and a thickness, positioned between the floating gate and the drain for providing a high capacitance between the floating gate and the drain; and
    a second layer of insulating material, having a dielectric constant and a thickness, positioned between the floating gate and the control gate for providing a minimal capacitance between the floating gate and the control gate and for permitting Fowler-Nordheim tunneling therebetween.

3. An electrically programmable and erasable memory device comprising:
    a substrate of semiconductor material of a first conductivity type;
    first and second spaced-apart regions in said substrate of a second conductivity type, with a channel region therebetween;
    a first insulating layer disposed over said substrate including over said first, second and channel regions;
    an electrically conductive floating gate disposed over said first insulating layer and extending over a portion of said channel region and over a portion of said second region to maximize a capacitive coupling therewith;
    a second insulating layer disposed over and adjacent said floating gate and having a thickness permitting Fowler-Nordheim tunneling of charges therethrough; and
    an electrically conductive control gate having two electrically connected sections, a first section disposed over said first insulating layer, spaced apart from said floating gate and adjacent to said second insulating layer, extending over a portion of said first region; said second section disposed over said second insulating layer to minimize capacitive coupling with said floating gate.

4. The device of claim 3, wherein said first insulating layer is silicon dioxide, silicon nitride or silicon oxynitride and is on the order of 70-200 angstroms in thickness.

5. The device of claim 3, wherein said second insulating layer, adjacent to said floating gate, is silicon dioxide, silicon nitride or silicon oxynitride and is on the order of 150-1200 angstroms in thickness.

6. In a method of operating an electrically programmable and erasable memory device of the type having a plurality of storage sites, a plurality of row address lines, a plurality of column address lines, and a common line, wherein each combination of one of the plurality of row address lines and one of the plurality of column address lines define a different one of the plurality of storage sites, and further wherein each of the plurality of storage sites comprises a single transistor having a source coupled to said common line, a drain coupled to an associated one of the plurality of column address lines, a control gate coupled to an associated one of the plurality of row address lines, and a floating gate for the storage of charges thereon, said floating gate being capacitively coupled to said drain and to said control gate, wherein said method comprising the steps of:
    erasing a first plurality of said storage sites by:
        applying a ground potential to said common line;
        applying a ground potential to a first plurality of column address lines associated with the first plurality of said storage sites;
        applying a first positive potential to a first plurality of row address lines associated with the first plurality of said storage sites thereby causing charges on said floating gate at each of said storage sites to be transferred to the control gate at each of said storage sites through Fowler-Nordheim tunneling;
    selectively programming a second plurality of said storage sites from the first plurality of storage sites erased by:
        applying a ground potential to said common line;

applying a second positive potential to a second plurality of column address lines associated with the second plurality of said storage sites; and
applying a third positive potential, less than said second positive potential, to a second plurality of row address lines associated with the second plurality of said storage sites, thereby causing electrons from the source of each storage site to be transferred to the floating gate by hot electron generated by abrupt potential drop.

* * * * *

UNITED STATES PATENT AND TRADEMARK OFFICE
CERTIFICATE OF CORRECTION

PATENT NO. : 5,029,130

DATED : July 2, 1991

INVENTOR(S) : BING YEH

It is certified that error appears in the above-identified patent and that said Letters Patent is hereby corrected as shown below:

Col. 3, line 46, delete "!6", and insert --16--;
Col. 4, lines 41, 43, and 63, change "gate 28" to --gate 29-- in all instances;
Col. 5, lines 6, 23, 26, 27, 35, 55, 60 and 62, change "gate 28" to --gate 29-- in all instances;
Col. 6, lines 5, 10, 19, 47, 60, 63 and 68, change "gate 28" to --gate 29-- in all instances;
Col. 6, line 25, in the equation, correct as follows:

$$V_{ie} = V_e * C_{fc} / (C_{fc} + C_{fb} + C_{fd})$$

Col. 6, line 54, change "floating gate 28" to --floating gate 22--;
Col. 7, lines 4, 27, 48, change "gate 28" to --gate 29--;
Col. 8, lines 4, 7, 14, 17, 44, 48, and 62, change "gate 28" to --gate 29--;
Col. 9, line 7, change "gate 28" to --gate 29--.

Signed and Sealed this

First Day of December, 1992

Attest:

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 5,029,130

DATED      : JULY 2, 1991

INVENTOR(S): BING YEH

It is certified that error appears in the above - identified patent and that said Letters Patent is hereby corrected as shown below:

On the Title Page and Col. 1, lines 1-3

DELETE "NON-VALATILE" AND INSERT --NON-VOLATILE--; SO THAT IT READS --SINGLE TRANSISTOR NON-VOLATILE ELECTRICALLY ALTERABLE SEMICONDUCTOR MEMORY DEVICE--.

Signed and Sealed this

Twenty-second Day of December, 1992

Attest:

DOUGLAS B. COMER

Attesting Officer        Acting Commissioner of Patents and Trademarks